(12) United States Patent
Gill et al.

(10) Patent No.: US 7,810,008 B2
(45) Date of Patent: Oct. 5, 2010

(54) METHOD FOR RECOVERING DATA IN A TAPE DRIVE SYSTEM

(75) Inventors: Richard Allen Gill, Arvada, CO (US); Howard H. Rather, Boulder, CO (US)

(73) Assignee: Oracle America, Inc., Redwood City, CA (US)

( * ) Notice: Subject to any disclaimer, the term of this patent is extended or adjusted under 35 U.S.C. 154(b) by 1167 days.

(21) Appl. No.: 11/440,682

(22) Filed: May 24, 2006

(65) Prior Publication Data
US 2007/0300133 A1 Dec. 27, 2007

(51) Int. Cl.
*G06F 11/30* (2006.01)
(52) U.S. Cl. .......................................... 714/746; 714/2
(58) Field of Classification Search ................ 714/746, 714/2
See application file for complete search history.

(56) References Cited

U.S. PATENT DOCUMENTS 5,331,476 A * 7/1994 Fry et al. ...................... 360/53
6,286,698 B2 * 9/2001 Hague et al. ................ 215/201
6,643,084 B1 * 11/2003 Andrew et al. ................ 360/53

\* cited by examiner

*Primary Examiner*—Scott T Baderman
*Assistant Examiner*—Enam Ahmed
(74) *Attorney, Agent, or Firm*—Gregory P. Durbin; Polsinelli Shughart PC

(57) ABSTRACT

A method is disclosed. The method includes performing a first read operation at a tape drive, determining if a minimum number of data bytes have been recovered in the first read operation to perform error correcting codes (ECC), performing a second read operation if the minimum number of data bytes to perform ECC have not been recovered, determining if a minimum number of data bytes have been recovered in the second read operation to perform ECC, combining the recovered data bytes from the first read operation and the second read operation to form combined recovered data bytes, determining if a minimum number of data bytes are included in the combined recovered data bytes to perform ECC and performing ECC if the minimum number of data bytes are included in the combined recovered data bytes.

20 Claims, 5 Drawing Sheets

|   | a | b | c | d | e | f | g | h |
|---|---|---|---|---|---|---|---|---|
| 0 | 0 | 0 | 0 | 0 | 0 | 0 | 0 | 0 |
| 1 | 0 | 0 | 0 | 0 | 0 | 0 | 0 | 0 |
| 2 | 0 | 0 | 0 | 0 | 0 | 0 | 0 | 0 |
| 3 | 0 | 0 | 0 | 0 | 0 | 0 | 0 | 0 |
| 4 | 0 | 0 | 0 | 0 | 0 | 0 | 0 | 0 |
| 5 | 0 | 0 | 0 | 0 | 0 | 0 | 0 | 0 |
| 6 | 0 | 0 | 0 | 0 | 0 | 0 | 0 | 0 |
| 7 | 0 | 0 | 0 | 0 | 0 | 0 | 0 | 0 |

*Fig. 4a*

|   | a | b | c | d | e | f | g | h |
|---|---|---|---|---|---|---|---|---|
| 0 | 0 | X | X | X | X | X | X | 0 |
| 1 | X | X | X | X | 0 | X | X | 0 |
| 2 | X | 0 | X | X | X | X | X | X |
| 3 | X | X | X | 0 | X | 0 | X | 0 |
| 4 | X | X | 0 | X | X | X | 0 | X |
| 5 | X | X | X | X | X | 0 | X | X |
| 6 | X | X | X | 0 | X | X | X | X |
| 7 | 0 | X | X | 0 | X | X | 0 | X |

*Fig. 4b*

|   | a | b | c | d | e | f | g | h |
|---|---|---|---|---|---|---|---|---|
| 0 | X̲ | X | 0 | 0 | 0 | X | X | 0 |
| 1 | X | X | X | X | 0 | X | X | 0 |
| 2 | X | 0 | X | X | X | X | X | X |
| 3 | X | X | X | 0 | X | 0 | X | 0 |
| 4 | X | X | 0 | X | X | X | 0 | X |
| 5 | X | X | X | X | X | 0 | X | X |
| 6 | X | X | X | 0 | X | X | X | X |
| 7 | X̲ | X | X | X̲ | X | X | 0 | X |

*Fig. 4c*

|   | a | b | c | d | e | f | g | h |
|---|---|---|---|---|---|---|---|---|
| 0 | X | X | X | X | X | X | X | 0 |
| 1 | X | X | X | X | 0 | X | X | 0 |
| 2 | X | 0 | X | X | X | X | X | X |
| 3 | X | X | X | 0 | X | 0 | X | 0 |
| 4 | X | X | 0 | X | X | X | 0 | X |
| 5 | X | X | X | X | X | 0 | X | X |
| 6 | X | X | X | 0 | X | X | X | X |
| 7 | X | X | X | X | X | X | 0 | X |

*Fig. 4d*

METHOD FOR RECOVERING DATA IN A TAPE DRIVE SYSTEM

FIELD OF INVENTION

An embodiment of the invention relates to the recording and retrieval of digital information on magnetic tape, and more particularly to methods and procedures for recovering from errors occurring during data transfer operations.

BACKGROUND OF INVENTION

Conventional tape drive data storage systems employ various error correction and recovery methods to detect and correct data errors which, if left unresolved, would compromise the integrity of information read from or written to the magnetic tape media. Events which can lead to data errors include defects on the media, debris between the tape head and the media, and other conditions that interfere with head/media data transfer operations.

Error correction and recovery may be thought of as two distinct operations that are employed at different stages of error processing. Error correction is conventionally implemented using error correction coding (ECC) techniques in which random host data to be placed on a tape medium is encoded in a well-defined structure by introducing data-dependent redundancy information. The presence of data errors is detected when the encoded structure is disturbed. The errors are corrected by making minimal alternations to reestablish the structure. ECC error correction is usually implemented "on-the-fly" as data is processed by the tape drive apparatus. The well-known Reed-Solomon code is one cyclic encoding scheme which has been proposed for ECC error correction. Other encoding schemes are also known in the art.

Error recovery occurs when ECC error correction is unable to correct data errors. The error recovery process usually requires stopping the tape and reprocessing one or more data blocks in which an error was detected. Thus, the tape drive system usually attempts to re-read the data and possibly attempts to change certain parameters that may enable the data block to be recoverable. In many instances there are portions of the data block that may be recoverable on a retry, but may not be sufficient to recover the data. On subsequent retries other areas of the data may be recoverable. Since all of the data or at least the minimum amount necessary for error correcting codes to be successful is not met, the block remains unrecoverable.

Therefore, it is desirable to both retrieve data that conventional tape drives may never retrieve in a timely manner.

SUMMARY OF INVENTION

The present invention includes novel methods and apparatus for recovering data in a tape drive system. According to one embodiment of the invention, a method is disclosed. The method includes performing a first read operation at a tape drive, determining if a minimum number of data bytes have been recovered in the first read operation to perform error correcting codes (ECC), performing a second read operation if the minimum number of data bytes to perform ECC have not been recovered, determining if a minimum number of data bytes have been recovered in the second read operation to perform ECC, combining the recovered data bytes from the first read operation and the second read operation to form combined recovered data bytes, determining if a minimum number of data bytes are included in the combined recovered data bytes to perform ECC and performing ECC if the minimum number of data bytes are included in the combined recovered data bytes.

According to another embodiment of the invention, an apparatus is disclosed. The apparatus includes a tape medium, a read/write head comprising read elements to read data from the tape medium and a read/write controller. The read/write controller includes a data protect component to combine data bytes recovered from two or more read operations in order to accumulate a minimum number of data bytes to perform error correcting codes (ECC).

DESCRIPTION OF THE DRAWINGS

The invention may be best understood by referring to the following description and accompanying drawings that are used to illustrate embodiments of the invention. In the drawings:

FIG. 4a-4d illustrate embodiments of a flag array.

DETAILED DESCRIPTION

A method for recovering data in a tape drive system is disclosed. In the following description, numerous details are set forth. It will be apparent, however, to one skilled in the art that embodiments of the present invention may be practiced without these specific details. In other instances, well-known structures, devices, and techniques have not been shown in detail, in order to avoid obscuring the understanding of the description. The description is thus to be regarded as illustrative instead of limiting.

Reference in the specification to "one embodiment" or "an embodiment" means that a particular feature, structure, or characteristic described in connection with the embodiment is included in at least an embodiment of the invention. The appearances of the phrase "in one embodiment" in various places in the specification are not necessarily all referring to the same embodiment.

Also, select embodiments of the present invention include various operations, which are described herein. The operations of the embodiments of the present invention may be performed by hardware components or may be embodied in machine-executable instructions, which may be in turn utilized to cause a general-purpose or special-purpose processor, or logic circuits programmed with the instructions, to perform the operations. Alternatively, the operations may be performed by a combination of hardware and software.

Moreover, embodiments of the present invention may be provided as computer program products, which may include machine-readable medium having stored thereon instructions used to program a computer (or other electronic devices) to perform a process according to embodiments of the present invention. The machine-readable medium may include, but is not limited to, floppy diskettes, hard disk, optical disks, CD-ROMs, and magneto-optical disks, read-only memories (ROMs), random-access memories (RAMs), erasable programmable ROMs (EPROMs), electrically EPROMs (EEPROMs), magnetic or optical cards, flash memory, or other types of media or machine-readable medium suitable for storing electronic instructions and/or data. Moreover, data discussed herein may be stored in a single database, multiple databases, or otherwise in select forms (such as in a table).

Figure 1:
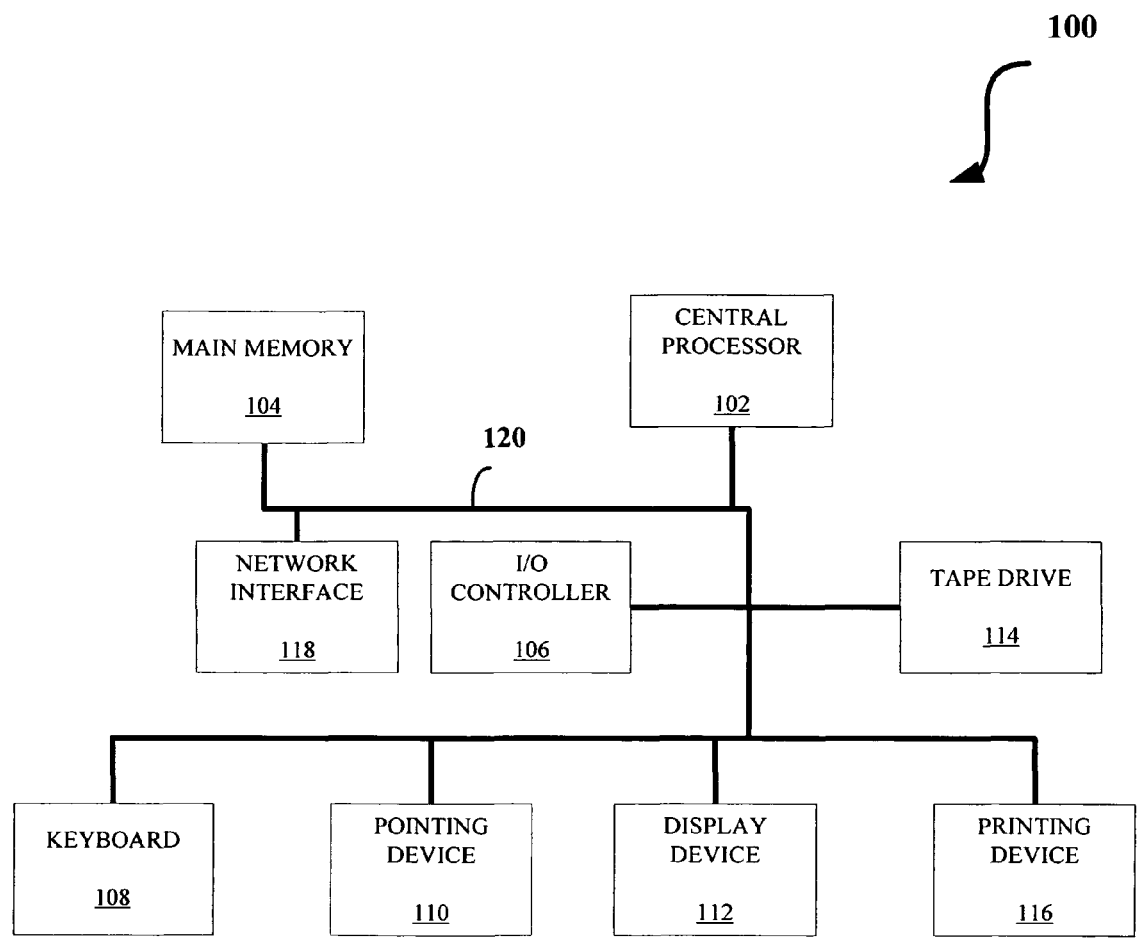
FIG. 1 illustrates one embodiment of a computer system.

FIG. 1 illustrates one embodiment of a computer system 100 in which certain embodiments of the present invention may be implemented. Computer system 100 comprises a central processor 102, a main memory 104, an input/output (I/O) controller 106, a keyboard 108, a pointing device 110 (e.g., mouse, track ball, pen device, or the like), a display device 112, and the like), and a network interface 118. Additional input/output devices, such as a printing device 116, may be included in the system 100 as desired. As illustrated, the various components of the system 100 communicate through a system bus 120 or similar architecture.

In a further embodiment, system 100 may be a distributed computing system. In other words, one or more of the various components of the system 100 may be located in a physically separate location than the other components of the system 100. Such components may be accessed and connected via a network to the other components In accordance with an embodiment of the present invention, the computer system 100 includes a Sun Microsystems computer utilizing a SPARC microprocessor available from several vendors (including Sun Microsystems, Inc., of Santa Clara, Calif.). Those with ordinary skill in the art understand, however, that any type of computer system may be utilized to embody the present invention, including those made by Hewlett Packard of Palo Alto, Calif., and IBM-compatible personal computers utilizing Intel microprocessor, which are available from several vendors (including IBM of Armonk, N.Y.).

Also, instead of a single processor, two or more processors (whether on a single chip or on separate chips) can be utilized to provide speedup in operations. It is further envisioned that the processor 102 may be a complex instruction set computer (CISC) microprocessor, a reduced instruction set computing (RISC) microprocessor, a very long instruction word (VLIW) microprocessor, a processor implementing a combination of instruction sets, and the like.

The network interface 118 provides communication capability with other computer systems on a same local network, on a different network connected via modems and the like to the present network, or to other computers across the Internet. In various embodiments of the present invention, the network interface 118 can be implemented utilizing technologies including, but not limited to, Ethernet, Fast Ethernet, Gigabit Ethernet (such as that covered by the Institute of Electrical and Electronics Engineers (IEEE) 801.1 standard), wide-area network (WAN), leased line (such as T1, T3, optical carrier 3 (OC3), and the like), analog modem, digital subscriber line (DSL and its varieties such as high bit-rate DSL (HDSL), integrated services digital network DSL (IDSL), and the like), cellular, wireless networks (such as those implemented by utilizing the wireless application protocol (WAP)), time division multiplexing (TDM), universal serial bus (USB and its varieties such as USB II), asynchronous transfer mode (ATM), satellite, cable modem, and/or FireWire.

Moreover, the computer system 100 may utilize operating systems such as Solaris, Windows (and its varieties such as CE, NT, 2000, XP, ME, and the like), HP-UX, IBM-AIX, PALM, UNIX, Berkeley software distribution (BSD) UNIX, Linux, Apple UNIX (AUX), Macintosh operating system (Mac OS) (including Mac OS X), and the like. Also, it is envisioned that in certain embodiments of the present invention, the computer system 100 is a general purpose computer capable of running any number of applications such as those available from companies including Oracle, Siebel, Unisys, Microsoft, and the like.

Figure 2:
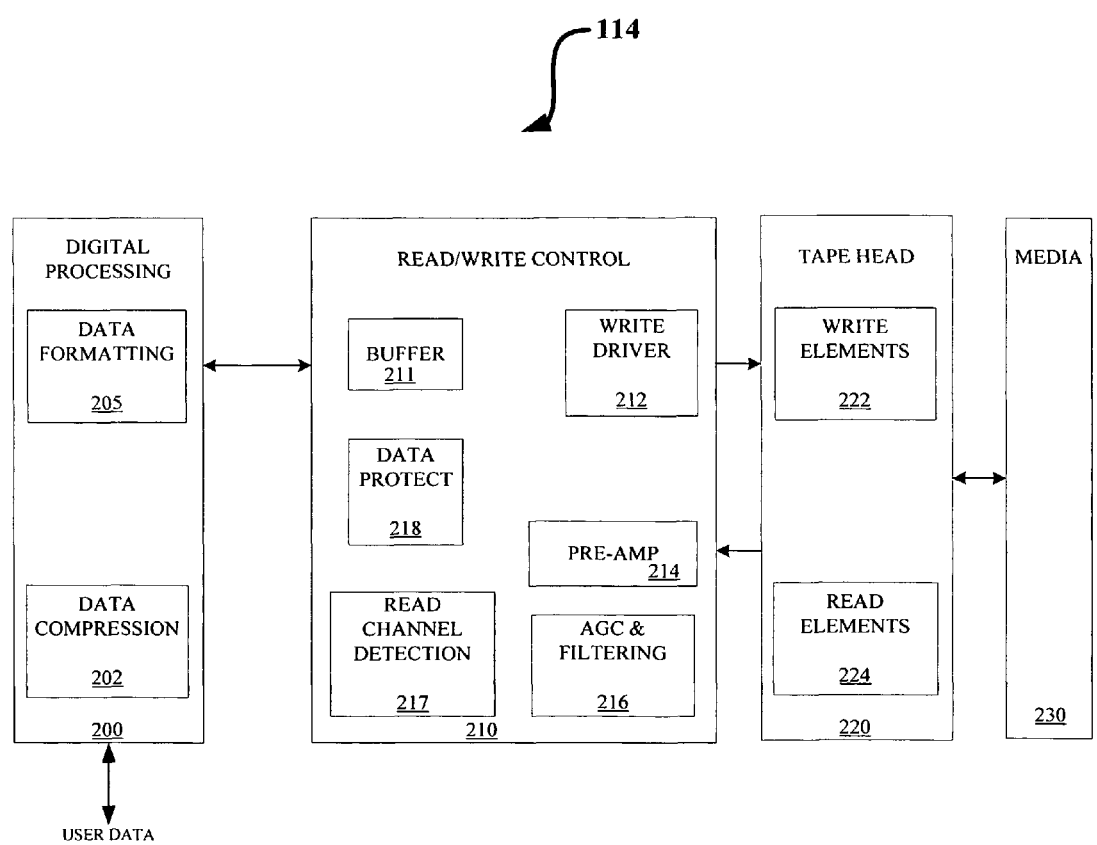
FIG. 2 is a block diagram illustrating one embodiment of a tape drive system.

Computer system 100 also includes a tape drive 114. Tape drive 114 may be coupled to I/O controller 106 via a FIBRE Channel interface. However, tape drive 114 may be coupled to I/O controller 106 via other types of interfaces (e.g., Fibre Connection (FICON) Channel, an Enterprise System Connection (ESCON), etc). FIG. 2 illustrates one embodiment of a tape drive 114. Tape drive 114 includes a digital processing unit 200, read/write control 210, tape head 220 and media 230.

Digital processing unit 200 receives user write data from I/O controller 106 that is forwarded for storage, and transmits received read data that is forwarded to I/O controller 106. Particularly, digital processing unit 200 includes a data compression unit 202 and data formatting unit 205. Data compression unit 202 compresses write data to be stored at tape drive 114, and decompresses read data to be forwarded to a user. Data formatting unit conditions write data that is to be stored at tape drive 114.

Media 230 is the physical tape medium on which data is stored. In one embodiment, media 230 is a magnetic tape. Tape head 220 is an electromagnetic component which reads and writes onto media 230 as media 230 passes over it. Tape head 220 includes write elements 222 and read elements 224 to perform the write and read operations.

Read/write control 210 controls the reading and writing of data at tape drive 114. Read/write control 210 includes a write driver 212, pre-amplifier 214, automatic gain and control (AGC) and filtering unit 216, read channel detection 217 and data protect 218. Write driver 212 is implemented to control the writing of user data to media 230.

Pre-amplifier 214 provides low noise amplification of a read signal received from read elements 224. Particularly, pre-amplifier 214 may create variation from read to re-read, and for changing off-sets for the tape head 220 to track follow the media 230. Additionally, there may be different types of adjustable parameters that may be changed depending upon the failure characteristics of media 230 and recording apparatus.

AGC and filtering unit 216 includes an AGC component that is implemented to adjust for variations in signal amplitude and to keep a fixed input signal to read channel detection. A filtering component of unit 216 is used to shape waveforms for better detection and forwards to a read channel detection 217.

Data protect 218 uses ECC to protect user data. In one embodiment, data protect 218 performs Reed Solomon (RS) encoding by adding bytes of data to user bytes to enable recovery of user data bytes when some bytes are missing due to defects or damage to media 230. Data protect 218 also provides data interleave and rotation which distributes user data and RS bytes over a larger piece of media 230. According to a further embodiment, data protect 218 writes to media 230 16 channels at a time to allow data to be distributed across the width of media 230.

According to one embodiment, RS encoding is performed by taking 52 user data bytes are at a time, with data protect 218 providing an additional 12 unique bytes to the 52 to form a special group of 64 bytes. The 64 byte group is referred to as a codeword. A codeword, when read from media 230, has the following properties: if up to any 12 bytes are missing the remaining bytes are used to recreate all 64 bytes, including the 52 bytes of customer data. If more than 12 bytes are missing, there is an attempt to re-read the data and possibly attempts to change certain parameters that may enable the data block to be recoverable.

As discussed above, there are many instances where portions of the data block may be recoverable on a retry but not sufficient to recover the data, where on subsequent retries other areas of the data may be recoverable. Since all of the data or at least the minimum amount necessary for error correcting codes to be successful is not met, the block remains unrecoverable.

According to one embodiment, data protect 218 implements a recording format that provides maximum partial data recovery when all of the data bytes in a block are not readable, and collectively accumulates the portions of the data block while checking for ECC minimum block presence. Once the minimum is detected the block is error corrected and reading resumes.

In one embodiment, readable bytes are identified as to their coordinate location within an array. In such an embodiment, a coordinate is assigned to a group of bytes having 512 bytes to a group. These groups may be referred to as "channel blocks". Channel blocks may (or may not) be detected on each read. However no matter the order the channel blocks are received (e.g., read), their location in the array are known by the coordinate, which is stored along with the group data. Once the data is forwarded to data protect 218, the array locations for which no data (e.g., group data) has been received is also forwarded to data protect 218

Figure 3:
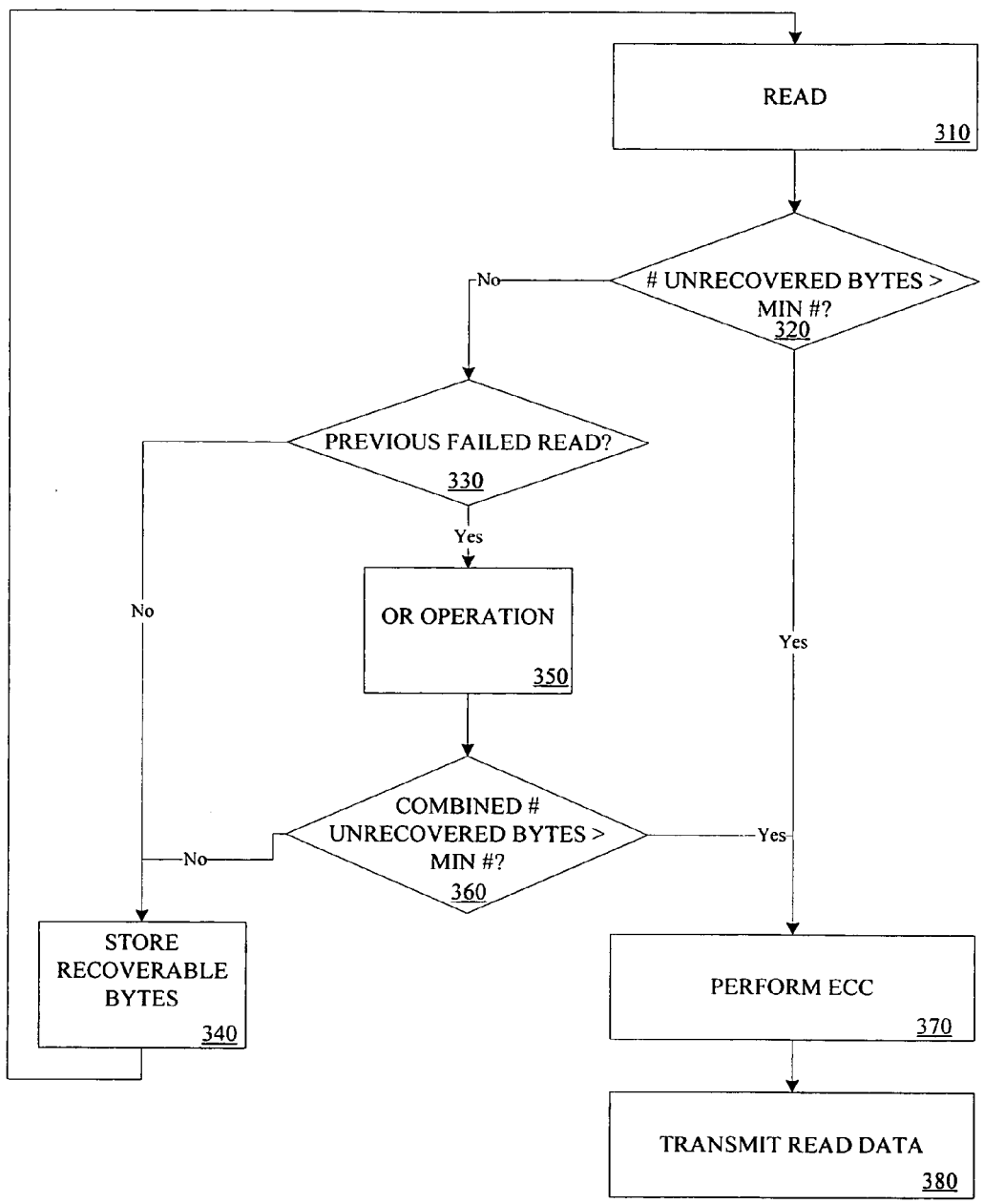
FIG. 3 is a flow diagram illustrating a method according to one embodiment.

FIG. 3 is a flow diagram illustrating one embodiment of the operation of data protect 218. At processing block 310 a read operation is performed at tape drive 114. At decision block 320, it is determined whether a minimum amount of data bytes for error correcting codes to be successful is not met (e.g., the number of unrecoverable bytes greater than the minimum number to perform ECC) remains unrecoverable. As discussed above, the minimum number bytes to perform ECC is 12. However in other embodiments, the minimum number of bytes may be implemented using other values.

If the minimum amount of data bytes necessary for error correcting codes to be successful is met, ECC is performed at processing block 370. At processing block 380, the read data is forwarded to the user via digital processing unit 200. However, if the minimum amount of data bytes for error correcting codes to be successful is not met, it is determined whether there has been a previous read where the minimum number of bytes has not been recovered, decision block 330.

If there has not been a previous read attempt (e.g., this is the first failed attempt), the bytes actually recovered are stored in a buffer 211 within read/write control 230. Subsequently, control is returned to processing block 310 where another read is attempted. If there have been previous failed read attempts, the recoverable bytes in the current read attempt is combined with recoverable bytes from one or more previous read attempts stored in buffer 211, processing block 340.

According to one embodiment, the recoverable data bytes are stored in two arrays within buffer 211. The first array is a three-dimensional array that stores the actual retrieved data, the physical location from which the data was read from media 230 and which of the 16 channels the data was read from. The second array is a two-dimensional array representing each of the 64 bytes.

In one embodiment, each array location is marked with a flag prior to a read command. FIG. 4a illustrates one embodiment of an array including "0" flags for each of the 64 bytes prior to a read. FIG. 4b illustrates one embodiment of an array after a first read attempt. In this embodiment, 49 bytes have been recorded, as indicated by an "X". However, 15 bytes (e.g., a0, h0, e1, etc.) that were not recovered still have flags. Thus, not enough bytes are available to perform ECC, and the array is stored in buffer 211.

FIG. 4c illustrates one embodiment of an array after a second read attempt. Again, only 49 bytes have been recorded, with 15 bytes (e.g., c0, d0, e0, etc.) not being recovered. Thus, enough bytes are not available to perform ECC. Referring back to FIG. 3, the current array is combined with the previously stored arrays at processing block 350. In one embodiment, the arrays are combined by performing an Or-operation. FIG. 4d illustrates one embodiment of an array after the combination of the arrays shown in FIGS. 4b and 4c.

Referring back to FIG. 3, it is determined whether the combined bytes recovered from the multiple read attempts are a minimum amount of data bytes for error correcting codes to be successful is not met. If the minimum amount of data bytes for error correcting codes to be successful is not met, control is returned to processing block 340 where the recoverable bytes in the current read attempt is combined with recoverable bytes from the previous read attempts stored in buffer 211.

However, if the minimum amount of data bytes necessary for error correcting codes to be successful is met, ECC is performed at processing block 370. At processing block 380, the read data is forwarded to the user via digital processing unit 200. Returning to FIG. 4d, the Or combination of the arrays results in three additional bytes being recovered (a0, a7 and d7). Thus, as a result of the combination, 52 bytes being recovered, with 12 unrecovered. As a result, ECC may be performed with the bytes recovered in FIG. 4d.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

The foregoing description has been directed to specific embodiments. It will be apparent to those with ordinary skill in the art that modifications may be made to the described embodiments, with the attainment of all or some of the advantages. Therefore, it is the object of the appended claims to cover all such variations and modifications as come within the spirit and scope of the invention.

What is claimed is:

1. A method comprising:
   performing a first read operation on a portion of a tape drive;
   determining if a minimum number of data bytes have been recovered in the first read operation to perform error correcting codes (ECC);
   performing a second read operation on the portion of the tape drive if the minimum number of data bytes to perform ECC have not been recovered;
   determining if a minimum number of data bytes have been recovered in the second read operation to perform ECC;
   combining the recovered data bytes from the first read operation and the second read operation to form combined recovered data bytes;
   determining if a minimum number of data bytes are included in the combined recovered data bytes to perform ECC; and
   performing ECC if the minimum number of data bytes are included in the combined recovered data bytes.

2. The method of claim 1 further comprising storing the recovered data bytes from the first read operation prior to performing the second read operation on the portion of the tape drive.

3. The method of claim 1 wherein combining the recovered data bytes from the first read operation and the second read operation comprises performing an Or-operation between the recovered data bytes from the first read operation and the second read operation.

4. The method of claim 1 further comprising performing a third read operation on the portion of the tape drive if the minimum number of data bytes included in the combined recovered data bytes are not sufficient to perform ECC.

5. The method of claim 4 further comprising:
  determining if a minimum number of data bytes have been recovered in the third read operation to perform ECC;
  combining the recovered data bytes from the third read operation and the combined recovered data bytes to form second combined recovered data bytes; and
  determining if a minimum number of data bytes are included in the second combined recovered data bytes to perform ECC.

6. The method of claim 1 further comprising transmitting the full set of data bytes from the tape drive after performing ECC.

7. The method of claim 1 further comprising performing ECC if the minimum number of data bytes have been recovered in the first read operation.

8. An apparatus, comprising:
  a tape medium;
  a read/write head comprising read elements to read data from a portion of the tape medium; and a read/write controller having a data protect component to combine data bytes recovered from two or more read operations from the portion of the tape medium in order to accumulate a minimum number of data bytes to perform error correcting codes (ECC).

9. The apparatus of claim 8 wherein the data protect component performs ECC once the minimum number of data bytes have been accumulated.

10. The apparatus of claim 8 wherein the read/write controller determines if the number of recovered data bytes includes the minimum number of data bytes to perform ECC.

11. The apparatus of claim 10 wherein the read/write controller further comprises a buffer to store the recovered data bytes if the recovered data bytes do not include the minimum number of data bytes to perform ECC.

12. The apparatus of claim 11 wherein the read/write controller further comprises:
  a pre-amplifier; and
  automatic gain control to adjust for variations in signal amplitude.

13. The apparatus of claim 12 further comprising a processing unit to format the data bytes once ECC is performed.

14. An article of manufacture, comprising a machine-accessible medium including data that, when accessed by a machine, cause the machine to perform operations comprising:
  performing a first read operation on a portion of a tape drive;
  determining if a minimum number of data bytes have been recovered in the first read operation to perform error correcting codes (ECC);
  performing a second read operation on the portion of the tape drive if the minimum number of data bytes to perform ECC have not been recovered;
  determining if a minimum number of data bytes have been recovered in the second read operation to perform ECC;
  combining the recovered data bytes from the first read operation and the second read operation to form combined recovered data bytes;
  determining if a minimum number of data bytes are included in the combined recovered data bytes to perform ECC; and
  performing ECC if the minimum number of data bytes are included in the combined recovered data bytes.

15. The article of manufacture of claim 14 wherein when accessed by a machine, further causes the machine to perform operations comprising storing the recovered data bytes from the first read operation prior to performing the second read operation on the portion of the tape drive.

16. The article of manufacture of claim 14 wherein combining the recovered data bytes from the first read operation and the second read operation comprises performing an Or-operation between the recovered data bytes from the first read operation and the second read operation.

17. The article of manufacture of claim 14 wherein when accessed by a machine, further causes the machine to perform operations comprising performing a third read operation on the portion of the tape drive if the minimum number of data bytes included in the combined recovered data bytes are not sufficient to perform ECC.

18. The article of manufacture of claim 17 wherein when accessed by a machine, further causes the machine to perform operations comprising:
  determining if a minimum number of data bytes have been recovered in the third read operation to perform ECC;
  combining the recovered data bytes from the third read operation and the combined recovered data bytes to form second combined recovered data bytes; and
  determining if a minimum number of data bytes are included in the second combined recovered data bytes to perform ECC.

19. The article of manufacture of claim 14 wherein when accessed by a machine, further causes the machine to perform operations comprising transmitting the full set of data bytes from the tape drive after performing ECC.

20. The article of manufacture of claim 14 wherein when accessed by a machine, further causes the machine to perform operations comprising performing ECC if the minimum number of data bytes have been recovered in the first read operation.

* * * * *